US006360180B1

(12) United States Patent
Breger

(10) Patent No.: US 6,360,180 B1
(45) Date of Patent: Mar. 19, 2002

(54) DRIVER WITH TRANSMISSION PATH LOSS COMPENSATION

(75) Inventor: Peter Breger, Calabasas, CA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 09/309,134

(22) Filed: May 10, 1999

(51) Int. Cl.$^7$ .......................... G01D 3/00; G01M 19/00; G01P 21/00

(52) U.S. Cl. ....................................... 702/108; 327/317

(58) Field of Search .............................. 702/108, 57–59, 702/67, 68, 117–123, 182–185; 327/317, 382, 285, 321, 165; 326/32, 26; 324/765; 716/4

(56) References Cited

U.S. PATENT DOCUMENTS

| | | | | |
|---|---|---|---|---|
| 4,975,598 A | * | 12/1990 | Borkar | 326/32 |
| 5,051,685 A | | 9/1991 | Sink | |
| 5,063,308 A | * | 11/1991 | Borkar | 326/26 |
| 5,189,313 A | | 2/1993 | Garuts | |
| 5,266,894 A | | 11/1993 | Takagi et al. | |
| 5,270,582 A | * | 12/1993 | Brown et al. | 327/285 |
| 5,287,022 A | | 2/1994 | Wilsher | |
| 5,329,222 A | | 7/1994 | Gyugyi et al. | |
| 5,444,410 A | * | 8/1995 | Polhemus | 327/317 |
| 5,528,166 A | | 6/1996 | Iikbahar | |
| 5,617,051 A | * | 4/1997 | Bimgham | 327/317 |
| 5,745,003 A | * | 4/1998 | Wakimoto et al. | 327/382 |
| 5,808,481 A | * | 9/1998 | Thompson | 326/83 |
| 5,842,155 A | | 11/1998 | Bryson et al. | |
| 5,870,409 A | | 2/1999 | Yach et al. | |
| 5,898,321 A | * | 4/1999 | Iikbahar et al. | 326/87 |
| 6,194,911 B1 | * | 2/2001 | Currin et al. | 326/765 |
| 6,292,014 B1 | * | 9/2001 | Hedberg | 326/30 |

OTHER PUBLICATIONS

Patent Abstract of Japan vol. 017, No. 295 (E–1377), Jun. 7, 1993 & JP 05 022106A (Toshiba Corp), Jan. 29, 1993 abstract.

* cited by examiner

Primary Examiner—Marc S. Hoff
Assistant Examiner—Demetrius Pretlow
(74) Attorney, Agent, or Firm—Lance M. Kreisman

(57) ABSTRACT

A driver for applying a deterministic waveform along a lossy transmission path to a device-under-test is disclosed. The driver includes a signal generator for producing a substantially square-wave signal at an output node and an injector coupled to the output node for modifying the square-wave signal to pre-compensate for expected losses along the lossy path.

9 Claims, 3 Drawing Sheets

US 6,360,180 B1

DRIVER WITH TRANSMISSION PATH LOSS COMPENSATION

FIELD OF THE INVENTION

The invention relates generally to automatic test equipment for testing semiconductor devices, and more particularly a driver having loss compensation circuitry for use in a semiconductor tester to test semiconductor devices.

BACKGROUND OF THE INVENTION

Automatic test equipment often plays a critical role in the manufacturing process for semiconductor devices. The equipment, often referred to as a "tester", simulates an operating environment for devices at the wafer and package levels. By verifying the operability of each semiconductor device under varying conditions, manufacturers can realize high yields, and a correspondingly higher level of reliability to customers. Not surprisingly, this translates into higher revenues for the semiconductor manufacturer.

Testers employed by semiconductor manufacturers generally include a computer workstation that runs test software for controlling the test. The software controls the signal parameters for test vectors or waveforms that will drive the semiconductor device. A pattern generator typically produces the waveforms and routes the signals to electronic circuits commonly referred to as pin electronics.

The pin electronics generally reside on one or more channel cards that route signals between the tester and one or more pins of the DUT. The pin electronics perform several tester functions and generally serve as a signal interface between the pattern generator and the DUT. One of the more important functions includes driving waveforms along a transmission path to the pins of the (DUT).

With reference to FIG. 1, one conventional driver employed in traditional pin electronics channel cards generally comprises a buffer amplifier 10 employed in an integrated circuit that includes respective high and low voltage clamps 12 and 14 to produce respective high VH and low VL voltage levels. A switch 16 selectively couples the buffer output between the voltage clamps according to a pre-programmed timing scheme controlled by the test controller. The switching between the respective clamps forms a substantially squarewave-shaped signal 18 for transmission along a signal path 20 to the DUT (not shown).

One of the problems associated with the conventional driver described above involves the timing accuracy of the actual waveform delivered to the DUT. At frequencies approaching the gigahertz range, the signal driven from the driver output is often subjected to losses arising from impedance mismatching along the transmission path. FIG. 2 illustrates an affected waveform with an original edge risetime at 22, and a subsequent degraded risetime at 24 due to skin effect impedance and dielectric losses. Because high frequency testing requires exacting timing parameters to adequately test a DUT, losses affecting edge risetimes and pulse shape, and hence timing accuracy, are often unacceptable to semiconductor manufacturers.

What is needed and heretofore unavailable is a driver for use in a semiconductor tester channel card that pre-compensates for transmission path signal losses to maximize timing accuracy and signal integrity for driver waveforms. The driver of the present invention satisfies this need.

SUMMARY OF THE INVENTION

The driver of the present invention employs pre-compensation circuitry to generate a waveform that, after propagating along a lossy transmission path, takes the form of the originally programmed signal. This allows highly accurate timing at the input pins of a DUT for edges propagating at relatively high frequencies.

To realize the foregoing advantages, the invention in one form comprises a driver for applying a deterministic waveform along a lossy transmission path to a device-under-test. The driver includes a signal generator for producing a substantially square-wave signal at an output node and an injector coupled to the output node for modifying the square-wave signal to pre-compensate for expected losses along the lossy path.

In another form, the invention comprises a channel card for use in a semiconductor tester to drive and capture signals to and from a device-under-test. The channel card includes a formatter and a comparator having an input coupled to the device-under-test and an output feeding the formatter. The channel card further includes a driver having an input coupled to the formatter and an output connected through a lossy transmission path to the device-under-test. The driver includes a signal generator for producing a substantially square-wave signal at an output node and an injector coupled to the output node for modifying the square-wave signal to pre-compensate for expected losses along the lossy path.

In yet another form, the invention comprises a method of applying a driving waveform from a driver output along a lossy signal path to a device-under-test. The method includes the steps of establishing a first clamped signal level; switching the driver output to the first clamped signal level; and injecting energy into the output node to modify the first clamped signal level and compensate for losses to the clamped signal level along the lossy signal path.

Other features and advantages of the present invention will be apparent from the following detailed description when read in conjunction with the accompanying drawings.

BRIEF DESCRIPTION OF THE DRAWINGS

The invention will be better understood by reference to the following more detailed description and accompanying drawings in which.

DETAILED DESCRIPTION OF THE INVENTION

Figure 1:
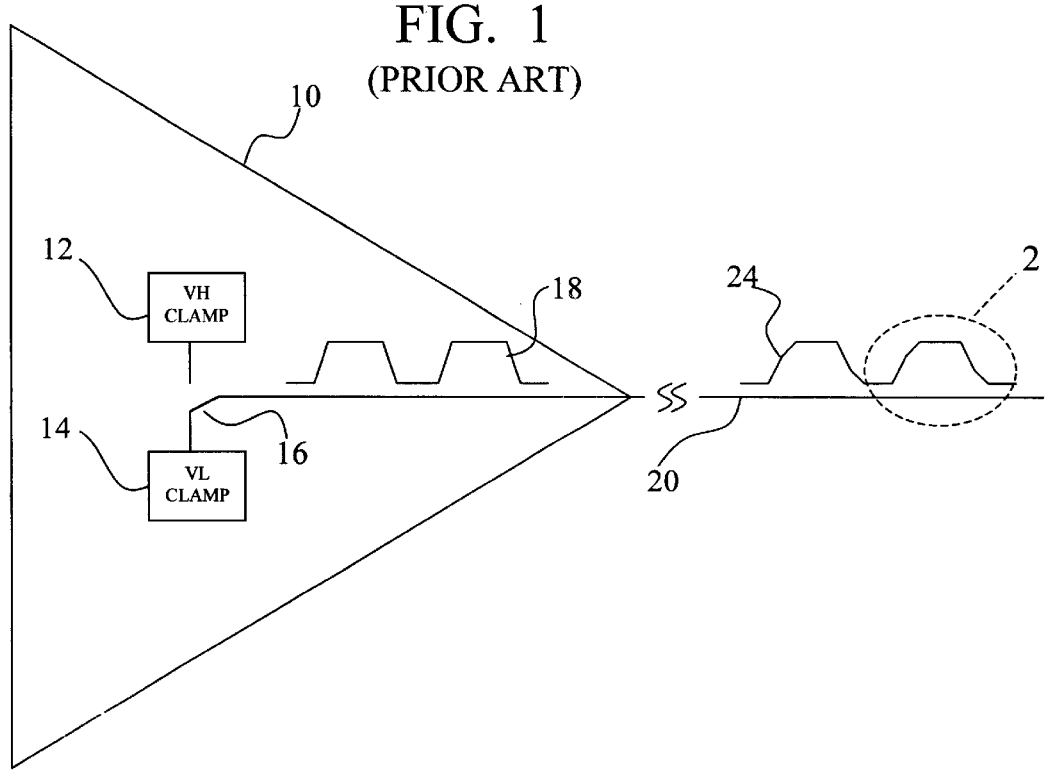
FIG. 1 is a block diagram of a conventional driver.
Figure 2:
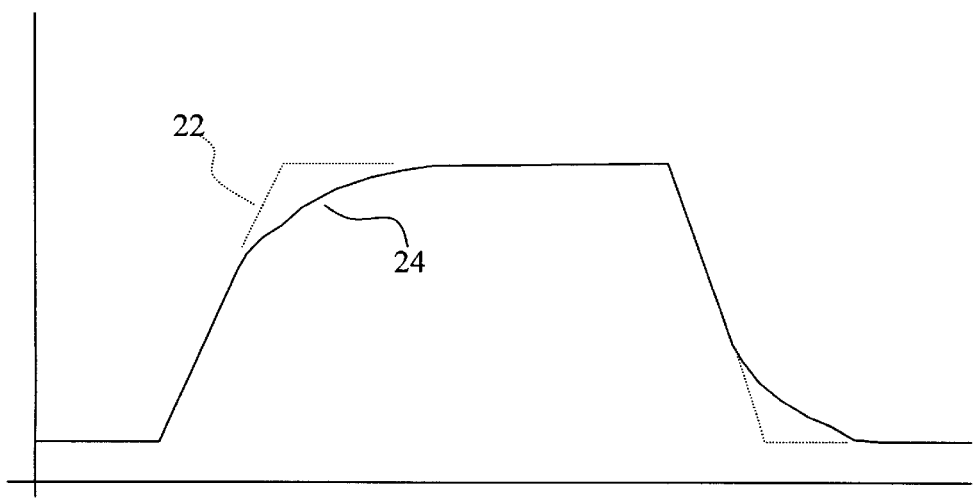
FIG. 2 is a graphical view of a waveform generated by the conventional driver of FIG. 1 after propagating along a lossy transmission path.
Figure 3:
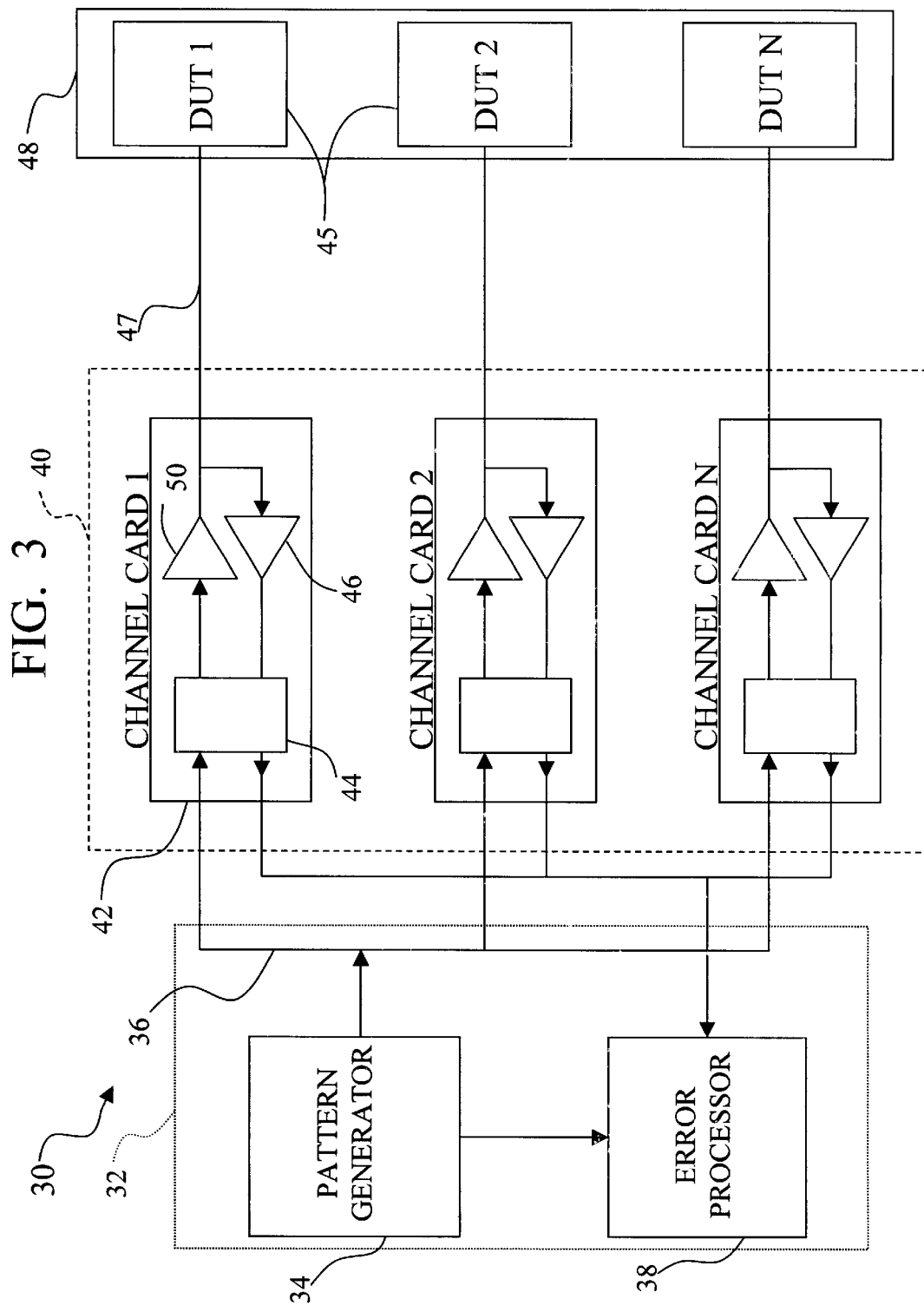
FIG. 3 is a block diagram of a semiconductor tester according to one embodiment of the present invention.

Referring now to FIG. 3, a tester according to one embodiment of the present invention, generally designated 30, includes a test controller 32 coupled to a test head 40. The test head includes a plurality of pin electronics channel cards 42 that employ drivers 50 to apply test waveforms to respective DUTs 45 mounted on a loadboard 48. The drivers include pre-compensation circuitry 60 (FIG. 4) to deliver high frequency signals with highly accurate edge timings to the DUTs.

Further referring to FIG. 3, the test controller includes a computer workstation (not shown) that controls operation of a pattern generator 34. The pattern generator preferably produces algorithmically-derived test signals for application to the DUT's 45 and feeds the signals along a pattern bus 36. The pattern bus fans out to provide a plurality of parallel pattern sources for coupling to the test head 40. The test controller also includes an error procesor 38 for analyzing signals captured by the tester to determine the results of the test.

The test head channel cards 42 each define one or more signal paths or channels between the tester and the DUT pins. The cards comprise circuit boards (not shown) mounted with application specific integrated circuits (ASICS) that carry out the functions of a formatter 44, one or more drivers 50, and one or more comparators 46. The channel cards interface to the pins of the DUTs 45 through a lossy transmission path 47 including probes (for wafer level testing, not shown) or connections to the loadboard 48 (for packaged-device testing).

The inventor has determined that at signal frequencies in the gigahertz range, PCB traces, signal path connections, and more importantly the phenomenas known as skin effect and dielectric loss all contribute to signal losses as the test waveforms propagate along the transmission path 47.

Figure 4:
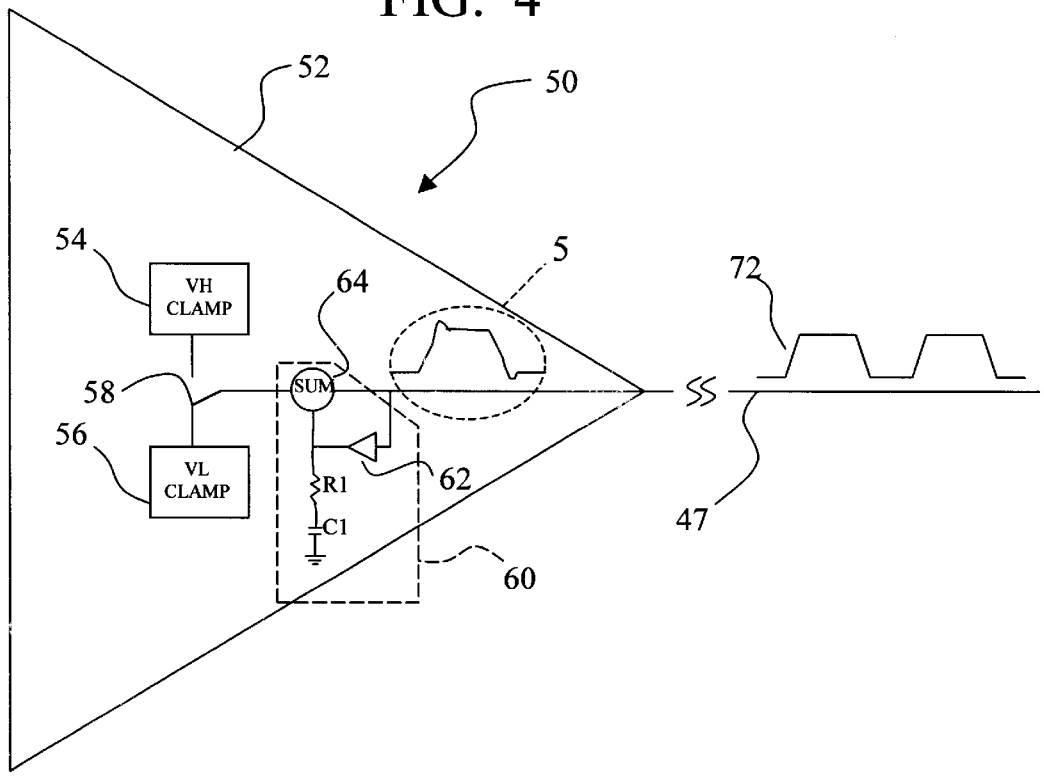
FIG. 4 is an enlarged block diagram of the driver shown in FIG. 3.

Referring more particularly now to FIG. 4, the driver according to one embodiment of the present invention, generally designated 50, comprises a buffer amplifier 52 configured to operate as a class AB device. As is well known in the art, class AB drivers employ a form of "push-pull" operation, but do not turn off completely. The driver output maintains a state that produces a certain amount of current at all times to keep the device active.

To carry out the push-pull operation, the driver 50 employs respective high and low voltage clamps 54 and 56 to produce respective high and low voltage levels VH and VL. A switch 58 selectively couples the driver output between the clamps depending on the desired waveform parameters of the test signals. Alternating between the high and low voltage clamps, the switch produces a substantially squarewave-shaped signal.

To compensate for the anticipated signal losses along the transmission path 47, the driver 50 incorporates pre-compensation circuitry preferably in the form of a current injector 60. The injector includes a series connected external RC network defined by resistor R1 and capacitor C1, and a feedback path comprising an injector buffer amplifier 62 disposed between the driver output and the RC network. The output of the injector feeds a summing node 64 that sums the squarewave signal produced by the signal generator and the injection signal to form a pre-compensated waveform 66.

In operation, the pattern generator feeds vector information (for logic devices) or address and data information (for memory devices) to the plurality of channel cards 42 that, in turn, format the patterns to create acceptable signals for application to the DUTs 45. The driver 50 responds to the formatted vector signals by first generating a substantially squarewave-shaped signal with the respective switched voltage clamps 54 and 56.

Figure 5:
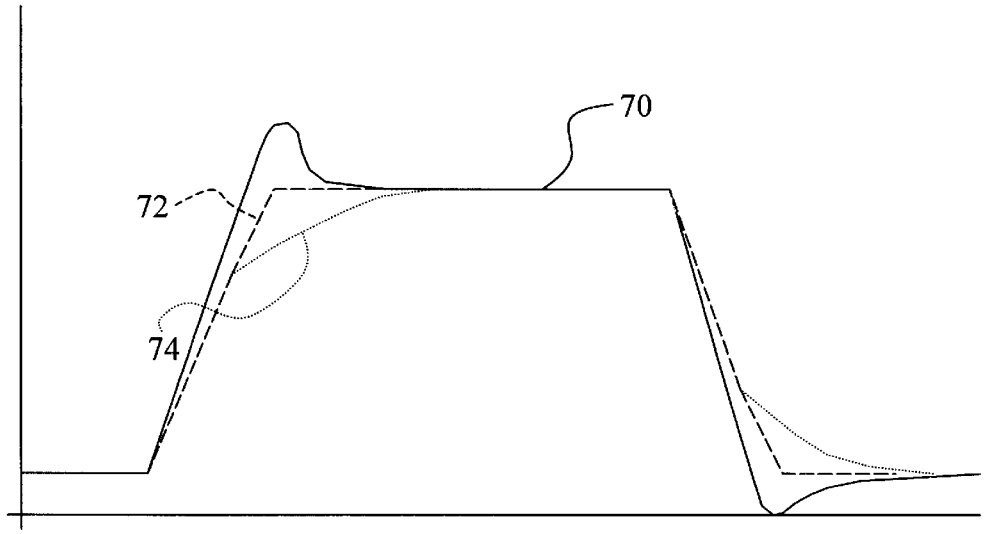
FIG. 5 is an enlarged graphical view of the pre-compensated signal enclosed in phantom in FIG. 4.

The injector buffer 62 samples the originally generated driver waveform and activates the RC circuit defined by R1 and C1. An instantaneous current is produced and injected into the summing node 64 to modify the leading and trailing edge rise and fall times of subsequent waveforms. The injected current drops off as the capacitor C1 discharges. FIG. 5 illustrates the resultant waveform 70 generated at the output of the driver.

As the waveform 70 propagates along the lossy transmission path 47, skin effect losses degrade the original over-compensated signal. By the time the signal reaches the DUT pin, the losses modify the waveform to a signal 72 (FIG. 4) similar to the originally programmed squarewave shape. Without the pre-compensation at the driver, the signal received at the DUT would resemble that shown at 74 (FIG. 5, in phantom).

The invention conveniently provides a means of adjusting the amount of pre-compensation by merely adjusting the values of R1 and C1, as is well known in the art to modify a transient time constant. The duration of the injected signal, or time constant, is proportional to the product of R1 and C1, while the magnitude of the injected signal varies inversely with the value of R1.

Those skilled in the art will appreciate the many benefits and advantages afforded by the present invention. Of particular importance is the pre-compensation feature employed by the driver to achieve a dramatic improvement in the timing accuracy and pulse shaping of the waveform edges received by the DUT pins. This provides the capability of expanding the allowable operating frequency parameters of a tester while maintaining the necessary accuracy requirements mandated by semiconductor manufacturers.

While the invention has been particularly shown and described with reference to the preferred embodiments thereof, it will be understood by those skilled in the art that various changes in form and detail may be made therein without departing from the spirit and scope of the invention. For example, while the invention is described above in terms of a Class AB driver, it should be understood that the invention is also applicable to other classes of drivers as well.

What is claimed is:

1. A driver for applying a deterministic waveform along a lossy transmission path to a device-under-test, said driver including:
    a signal generator for producing a substantially square-wave signal at an output node; and
    an injector coupled to said output node for modifying said square-wave signal to pre-compensate for expected losses along said lossy path.

2. A driver according to claim 1 wherein said signal generator comprises:
    a first clamping circuit for setting a first signal level;
    a second clamping circuit for generating a second signal level; and
    an output switch coupled to said first and second clamping circuits and operative to selectively pass said first and second signal levels to said output node.

3. A driver according to claim 1 wherein said injector comprises:
    an output sampler coupled to said output node; and
    an RC network coupled to said output sampler to generate a compensation signal based on the signal sampled by said output sampler.

4. A driver according to claim 3 wherein said compensation signal comprises injection current to modify a portion of said substantially square-wave signal.

5. A channel card for use in a semiconductor tester to drive and capture signals to and from a device-under-test, said channel card including:
    a formatter;
    a comparator having an input coupled to said device-under-test and an output feeding said formatter; and
    a driver having an input coupled to said formatter and an output connected through a lossy transmission path to said device-under-test, said driver including:

a signal generator for producing a substantially square-wave signal at an output node; and an injector coupled to said output node for modifying said square-wave signal to pre-compensate for expected losses along said lossy path.

6. A channel card according to claim 5 wherein said signal generator comprises:

a first clamping circuit for setting a first signal level;

a second clamping circuit for generating a second signal level; and an output switch coupled to said first and second clamping circuits and operative to selectively pass said first and second signal levels to said output node.

7. A channel card according to claim 5 wherein said injector comprises:

an output sampler coupled to said output node; and an RC network coupled to said output sampler to generate a compensation signal based on the signal sampled by said output sampler.

8. A method of applying a driving waveform from a driver output along a lossy signal path to a device-under-test, said method including the steps of:

establishing a first clamped signal level;

switching said driver output to said first clamped signal level; and injecting energy into said output node to modify said first clamped signal level and compensate for losses to said clamped signal level along said lossy signal path.

9. A method according to claim 8 wherein said injecting step includes:

sampling the signal at said driver output; and applying said energy at said output node at a level dependent on the signal sampled in said sampling step.

* * * * *